United States Patent
Park et al.

(10) Patent No.: US 9,583,430 B2
(45) Date of Patent: Feb. 28, 2017

(54) PACKAGE-ON-PACKAGE DEVICE

(71) Applicants: Kyol Park, Daejeon (KR); Jichul Kim, Yongin-si (KR); Yunhyeok Im, Hwaseong-si (KR); Eon Soo Jang, Suwon-si (KR)

(72) Inventors: Kyol Park, Daejeon (KR); Jichul Kim, Yongin-si (KR); Yunhyeok Im, Hwaseong-si (KR); Eon Soo Jang, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/457,094

(22) Filed: Aug. 11, 2014

(65) Prior Publication Data

US 2015/0115467 A1    Apr. 30, 2015

(30) Foreign Application Priority Data

Oct. 30, 2013    (KR) .................. 10-2013-0130424

(51) Int. Cl.
    *H01L 23/538*    (2006.01)
    *H01L 23/522*    (2006.01)
    (Continued)

(52) U.S. Cl.
    CPC ...... *H01L 23/5226* (2013.01); *H01L 23/3128* (2013.01); *H01L 23/36* (2013.01); *H01L 23/49811* (2013.01); *H01L 23/49827* (2013.01); *H01L 23/5385* (2013.01); *H01L 23/552* (2013.01); *H01L 25/105* (2013.01); *H01L 25/50* (2013.01); *H05K 1/0207* (2013.01); *H05K 1/141* (2013.01); *H01L 23/42* (2013.01); *H01L 24/73* (2013.01); *H01L 25/0657* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2224/92225* (2013.01);
    (Continued)

(58) Field of Classification Search
    None
    See application file for complete search history.

(56) References Cited

U.S. PATENT DOCUMENTS 7,642,656 B2    1/2010    Yoo et al.
8,105,872 B2    1/2012    Pagaila et al.
(Continued)

FOREIGN PATENT DOCUMENTS

KR    20050031599 A    4/2005

*Primary Examiner* — Kimberly Rizkallah
*Assistant Examiner* — Bo Bin Jang
(74) *Attorney, Agent, or Firm* — Renaissance IP Law Group LLP

(57) ABSTRACT

The inventive concepts provide package-on-package (PoP) devices. In the PoP devices, an interposer substrate and a thermal boundary material layer may be disposed between a lower semiconductor package and an upper semiconductor package to rapidly exhaust heat generated from a lower semiconductor chip included in the lower semiconductor package. The interposer substrate may be formed of one or more insulating layers, conductive vias, heat dissipating members, protection layers, and various conductive patterns.

16 Claims, 23 Drawing Sheets

(51) Int. Cl.
  *H01L 23/552* (2006.01)
  *H01L 25/10* (2006.01)
  *H01L 25/00* (2006.01)
  *H01L 23/31* (2006.01)
  *H01L 23/36* (2006.01)
  *H01L 23/498* (2006.01)
  *H05K 1/02* (2006.01)
  *H05K 1/14* (2006.01)
  *H01L 25/065* (2006.01)
  *H01L 23/42* (2006.01)
  *H01L 23/00* (2006.01)

(52) U.S. Cl.
  CPC ........ *H01L 2225/0651* (2013.01); *H01L 2225/06568* (2013.01); *H01L 2225/107* (2013.01); *H01L 2225/1023* (2013.01); *H01L 2225/1058* (2013.01); *H01L 2225/1094* (2013.01); *H01L 2924/15311* (2013.01); *H01L 2924/15331* (2013.01); *H01L 2924/181* (2013.01); *H05K 2201/10378* (2013.01)

(56) References Cited

U.S. PATENT DOCUMENTS

| | | | |
|---|---|---|---|
| 2008/0211089 A1* | 9/2008 | Khan et al. | 257/723 |
| 2008/0308950 A1 | 12/2008 | Yoo et al. | |
| 2009/0174081 A1 | 7/2009 | Furuta | |
| 2010/0140759 A1* | 6/2010 | Pagaila | H01L 21/565 257/660 |
| 2011/0169150 A1* | 7/2011 | Su et al. | 257/675 |
| 2011/0298109 A1 | 12/2011 | Pagaila et al. | |
| 2011/0304015 A1* | 12/2011 | Kim et al. | 257/532 |
| 2012/0013007 A1 | 1/2012 | Hwang et al. | |
| 2012/0139105 A1* | 6/2012 | Lin et al. | 257/737 |
| 2012/0211885 A1 | 8/2012 | Choi et al. | |
| 2013/0075887 A1 | 3/2013 | Suzuki | |

* cited by examiner

PACKAGE-ON-PACKAGE DEVICE

CROSS-REFERENCE TO RELATED APPLICATION

This U.S. non-provisional patent application claims priority under 35 U.S.C. §119 to Korean Patent Application No. 10-2013-0130424, filed on Oct. 30, 2013, in the Korean Intellectual Property Office, the disclosure of which is hereby incorporated by reference in its entirety.

BACKGROUND

The inventive concepts relate to package-on-package devices.

High performance, high speed, and small electronic components have been increasingly demanded with the development of an electronic industry. Semiconductor mounting techniques involving stacking semiconductor chips on one package substrate and stacking a package on a package have been suggested in order to satisfy such demands. Since each package included in a package-on-package (PoP) device includes a semiconductor chip and a package substrate, the PoP device may become thicker. Additionally, it is difficult to exhaust heat generated from semiconductor chips of the PoP device to outside of the PoP device. Thus, the PoP device may malfunction or an operating speed of the PoP device may be impacted.

SUMMARY

Embodiments of the inventive concepts may provide package-on-package devices capable of effectively exhausting heat.

Embodiments of the inventive concept provide a package-on-package device including: a lower semiconductor package including a lower package substrate and a lower semiconductor chip mounted on the lower package substrate; an upper semiconductor package disposed on the lower semiconductor package, the upper semiconductor package including an upper package substrate and an upper semiconductor chip mounted on the upper package substrate; an interposer substrate disposed between the lower semiconductor package and the upper semiconductor package, the interposer substrate electrically connecting the lower semiconductor package to the upper semiconductor package; and a first thermal boundary material layer disposed between the lower semiconductor package and the interposer substrate.

In some embodiments, the interposer substrate may have a thermal conductivity of about 10 watts per meter Kelvin (W/mK) or more.

In some embodiments, the interposer substrate may include: a substrate body; an upper conductive pattern and a lower conductive pattern disposed on a top surface and a bottom surface of the substrate body, respectively; and a conductive via penetrating the substrate body and electrically connecting the upper conductive pattern to the lower conductive pattern.

In some embodiments, the interposer substrate may further include: a heat dissipating member disposed within the substrate body.

In some embodiments, the heat dissipating member may include at least one of a metal or graphite.

In some embodiments, the conductive via may be in contact with the heat dissipating member. A ground voltage may be applied to the heat dissipating member. The heat dissipating member may be configured to receive the ground voltage.

In some embodiments, the heat dissipating member may be spaced apart from the conductive via.

In some embodiments, the lower semiconductor package may further include: a connecting member spaced apart from the lower semiconductor chip on the lower package substrate. The connecting member may electrically connect the lower package substrate to the interposer substrate.

In some embodiments, the connecting member may include at least one of a conductive bump and a solder ball.

In some embodiments, the lower semiconductor package may further include: a lower mold layer covering a top surface of the lower package substrate and a sidewall of the lower semiconductor chip. The lower mold layer may include a hole in which the connecting member is disposed.

In some embodiments, the lower mold layer may extend to cover a top surface of the lower semiconductor chip.

In some embodiments, the package-on-package device may further include: a second thermal boundary material layer disposed between the upper package substrate and the interposer substrate.

In some embodiments, the upper semiconductor package may further include: an upper mold layer covering the upper semiconductor chip and the upper package substrate. In this case, the package-on-package device may further include: a third thermal boundary material layer disposed on the upper mold layer; and a heat radiating member disposed on the third boundary material layer.

In some embodiments, the heat radiating member may extend to cover a sidewall of the upper semiconductor package, a sidewall of the interposer substrate and a sidewall of the lower semiconductor package.

In some embodiments, an interposer substrate is configured to be interposed between a lower semiconductor package and an upper semiconductor package. The interposer substrate may include a substrate body including an insulating layer having a top surface and a bottom surface, first conductive patterns arranged adjacent to edges of the top surface of the insulating layer of the substrate body, second conductive patterns arranged adjacent to edges of the bottom surface of the insulating layer of the substrate body, conductive vias connecting each of the first conductive patterns to a corresponding one of the second conductive patterns, and a heat dissipating member disposed centrally within the substrate body.

The heat dissipating member may be referred to as a first heat dissipating member and the conductive vias may be referred to as first conductive vias. The interposer substrate may further include a second heat dissipating member disposed within the substrate body, first inner interconnections, wherein each of the first conductive vias is connected between a corresponding one of the first conductive patterns and a corresponding one of the first inner interconnections, second conductive vias, second inner interconnections, wherein each of the second conductive vias is connected between a corresponding one of the first inner interconnections and a corresponding one of the second inner interconnections, and third conductive vias connecting each of the second inner interconnections to a corresponding one of the second conductive patterns.

In some embodiments, a first protection layer may cover the top surface of the substrate body of the interposer substrate and expose at least portions of the first conductive patterns. A second protection layer may cover the bottom surface of the substrate body of the interposer substrate and expose at least portions of the second conductive patterns.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
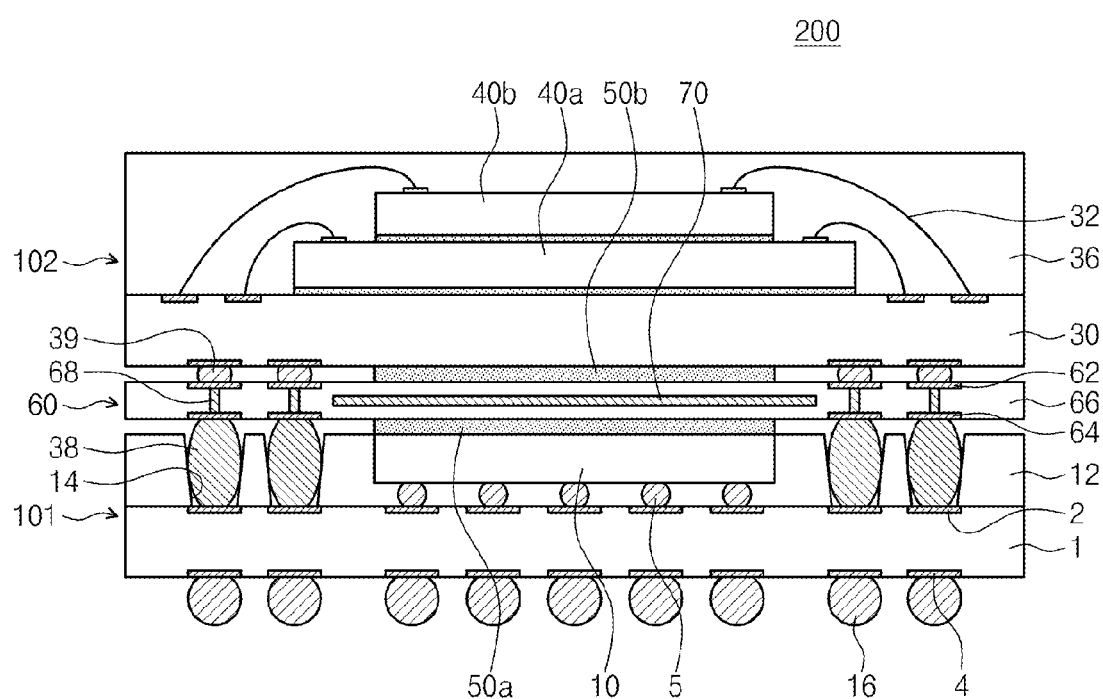
FIG. 1 is a cross-sectional view illustrating a package-on-package device according to a first embodiment of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises," "comprising," "includes," and/or "including" when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIG. 1 is a cross-sectional view illustrating a package-on-package device according to a first embodiment of the inventive concepts.

Referring to FIG. 1, a package-on-package (PoP) device 200 according to the present embodiment includes a lower semiconductor package 101, an interposer substrate 60, and an upper semiconductor package 102, which are sequentially stacked.

The lower semiconductor package 101 includes a lower package substrate 1, a lower semiconductor chip 10 mounted on the lower package substrate 1, and a lower mold layer 12 covering the lower package substrate 1 and the lower semiconductor chip 10. The lower package substrate 1 may be a printed circuit board (PCB). First lower conductive patterns 2 are disposed on a top surface of the lower package substrate 1, and second lower conductive patterns 4 are disposed on a bottom surface of the lower package substrate 1. Even though not illustrated in the drawings, conductive vias may be disposed in the lower package substrate 1. The conductive vias may electrically connect the first lower conductive patterns 2 to the second lower conductive patterns 4. Additionally, the top and bottom surfaces of the lower package substrate 1 may be covered with protection layers partially exposing the lower conductive patterns 2 and 4. Some of the lower conductive patterns 2 and 4 may function as connecting terminals, interconnections, or ball lands on which solder balls are disposed. The lower semiconductor chip 10 may be electrically connected to some of the first lower conductive patterns 2 through first lower solder bumps 5. The lower semiconductor chip 10 may be mounted by a flip-chip bonding technique. Second lower solder bumps 16 may be disposed on the bottom surface of the lower package substrate 1.

The lower mold layer 12 may cover a sidewall of the lower semiconductor chip 10 but may expose a top surface of the lower semiconductor chip 10. In other words, the top surface of the lower semiconductor chip 10 need not be covered by the lower mold layer 12. The lower mold layer 12 includes connecting holes 14 exposing some of the first lower conductive patterns 2. The lower semiconductor chip 10 may be, for example, a logic chip. The lower semiconductor chip 10 may include at least one of various devices such as a central processor unit (CPU), a graphic processor unit (GPU), a universal serial bus (USB), or the like.

The upper semiconductor package 102 includes an upper package substrate 30, upper semiconductor chips 40a and 40b mounted on the upper package substrate 30, and an upper mold layer 36 covering the upper package substrate 30 and the upper semiconductor chips 40a and 40b. The upper package substrate 30 may be a printed circuit board (PCB). The upper semiconductor chips 40a and 40b include a first upper semiconductor chip 40a and a second upper semiconductor chip 40b. All the upper semiconductor chips 40a and 40b may be connected to the upper package substrate 30 through conductors (e.g., wires 32) by a wire bonding technique. The upper semiconductor chips 40a and 40b may be, for example, memory chips.

FIG. 1 illustrates parts of the interposer substrate 60. The interposer substrate 60 is described in more detail below with reference to FIGS. 2 to 4.

Figure 2:
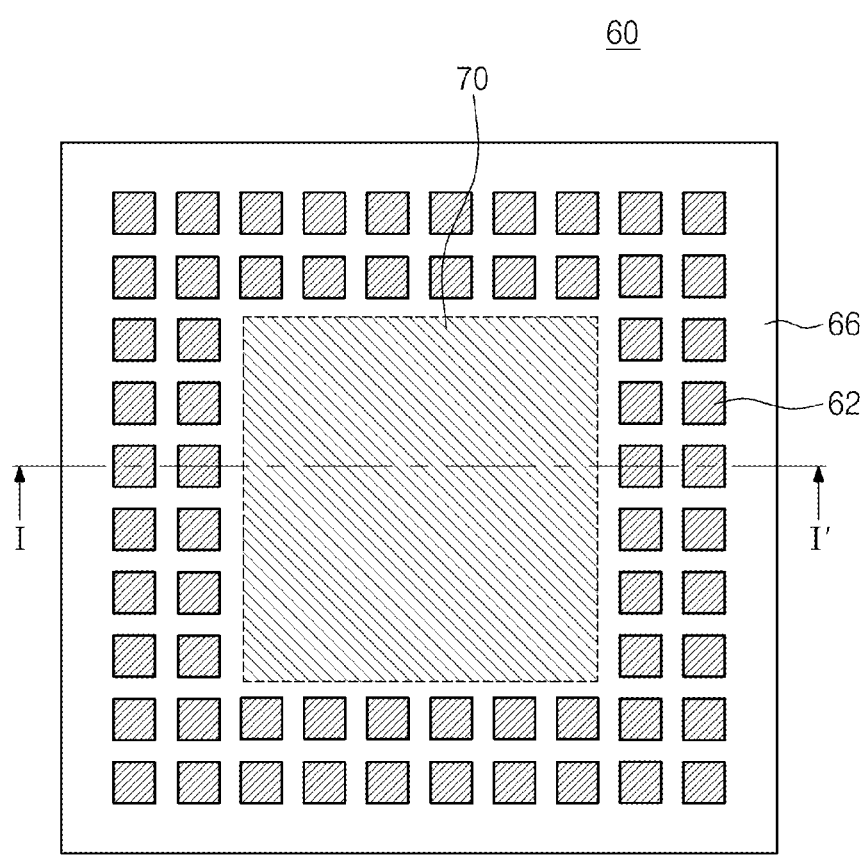
FIG. 2 is a layout of an interposer substrate according to an embodiment of the inventive concepts.
Figure 3:
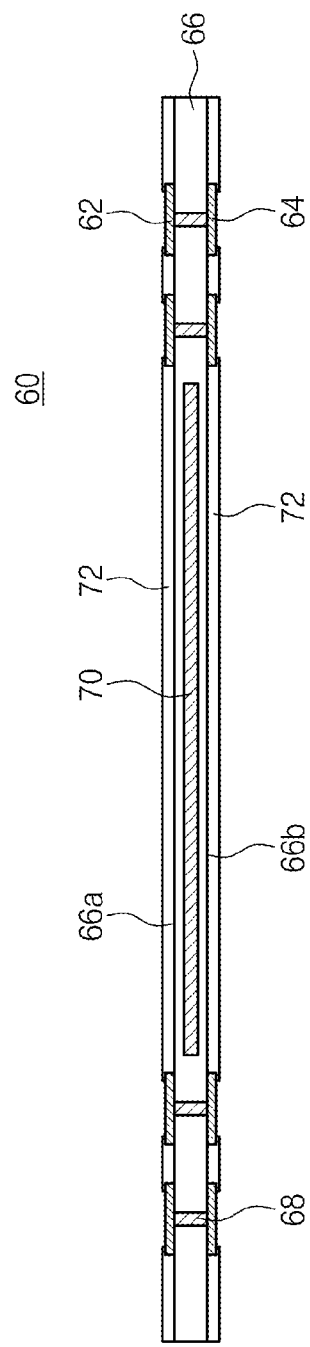
FIGS. 3 and 4A are cross-sectional views taken along a line I-I' of FIG. 2 according to embodiments of the inventive concepts.
Figure 4A:
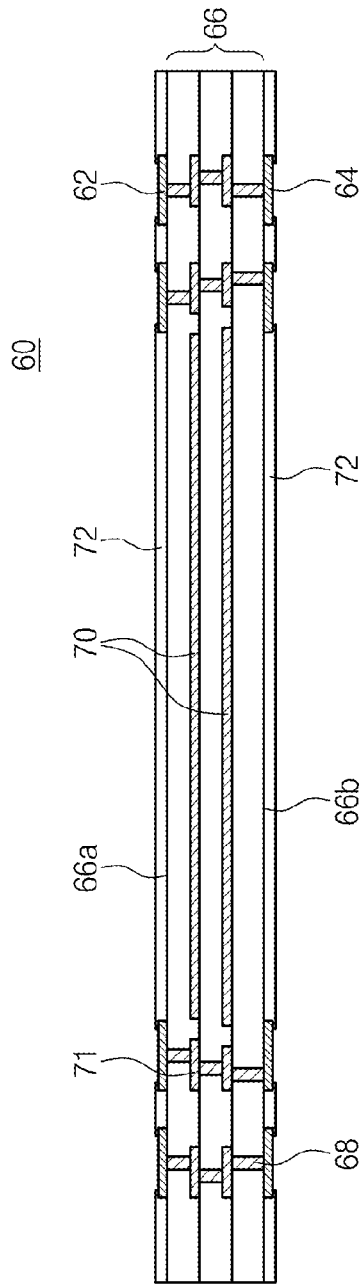

FIG. 2 is a layout of the interposer substrate 60 according to an embodiment of the inventive concepts. FIGS. 3 and 4A are cross-sectional views taken along a line I-I' of FIG. 2 according to embodiments of the inventive concepts.

Referring to FIGS. 1 to 4A, the interposer substrate 60 includes a body 66. The body 66 may include, for example, a single insulating layer. For example, the body 66 may be formed of an insulating ceramic or an insulating plastic. The body 66 includes a top surface 66a and a bottom surface 66b. First conductive patterns 62 are disposed on the top surface 66a, and second conductive patterns 64 are disposed on the bottom surface 66b. Conductive vias 68 are disposed within the body 66. The conductive vias 68 penetrate the body 66 to electrically connect the first conductive patterns 62 to the second conductive patterns 64, respectively. A heat dissipating member 70 is disposed in the body 66. The heat dissipating member 70 may be spaced apart from the conductive via 68 and the conductive patterns 62 and 64. The heat dissipating member 70 may be formed of a material having excellent thermal conductivity. For example, the heat dissipating member 70 may include at least one of a metal and graphite. In particular, the graphite has the excellent thermal conductivity in an in-plane direction. Thus, the graphite may rapidly diffuse or exhaust heat generated from a specific portion of the lower semiconductor chip 10 in the in-plane direction such that a temperature of the lower semiconductor chip 10 may be reduced. Each of the top and bottom surfaces 66a and 66b of the body 66 is covered with a protection layer 72. The protection layers 72 may expose portions of the conductive patterns 62 and 64.

Put differently, a substrate body 66 may include an insulating layer having a top surface 66a and a bottom surface 66b. First conductive patterns 62 may be arranged adjacent to edges of the top surface 66a of the insulating layer of the substrate body 66. Second conductive patterns 64 may be arranged adjacent to edges of the bottom surface 66b of the insulating layer of the substrate body 66. Conductive vias 68 may connect each of the first conductive patterns 62 to a corresponding one of the second conductive patterns 64. A heat dissipating member 70 may be disposed centrally within the substrate body 66.

Since the interposer substrate 60 includes the heat dissipating member 70 having the excellent thermal conductivity, a total thermal conductivity (or a net thermal conductivity) of the interposer substrate 60 is increased. In some embodiments, the interposer substrate 60 may have the total (or net) thermal conductivity of about 10 W/mK or more.

Alternatively, the interposer substrate 60 may be manufactured by a semiconductor manufacturing process using a silicon wafer. In this case, transistors may also be disposed in the interposer substrate 60.

Thermal boundary material layers 50a and 50b are disposed between the interposer substrate 60 and the lower semiconductor package 101, and between the interposer substrate 60 and the upper semiconductor package 102, respectively. Each of the thermal boundary material layers 50a and 50b may include an adhesive layer, thermal grease, and/or thermal epoxy. At least one of the thermal boundary material layers 50*a* and 50*b* may include a metal solid particle.

The interposer substrate 60 and the lower semiconductor package 101 may be electrically connected to each other through first connecting members 38. The first connecting members 38 are disposed in the connecting holes 14, respectively. The interposer substrate 60 and the upper semiconductor package 102 may be electrically connected to each other through second connecting members 39. In the present embodiment, the connecting members 38 and 39 may be solder balls.

In the PoP device 200, the interposer substrate 60 and the thermal boundary material layers 50*a* and 50*b* are disposed between the lower semiconductor package 101 and the upper semiconductor package 102, so that the heat generated from the lower semiconductor chip 10 may be quickly exhausted. Thus, an operating speed of the PoP device 200 is improved and malfunctions are reduced or eliminated. In particular, the CPU that may be included in the lower semiconductor chip 10 may generate much heat. However, since the heat may be rapidly exhausted in the PoP device having the above structure according to embodiments of the inventive concepts, a start time of dynamic thermal management (DTM) may be delayed to maximize the use of the CPU. Additionally, it is possible to reduce or minimize a frequency loss of the CPU in the lower semiconductor chip 10.

Alternatively, a body 66 of the interposer substrate 60 may be formed of a plurality of insulating layers as shown in FIG. 4A. In this case, a plurality of conductive vias 68 may penetrate the insulating layers, respectively. Inner interconnections 71 (as shown in FIG. 4A) may be disposed between the conductive vias 68 and may electrically connect the conductive vias 68 to each other. The heat dissipating member 70 may be disposed through a plurality of the insulting layers in the body 66. The heat dissipating member 70 may be formed of the same material as the inner interconnections 71. Moreover, the heat dissipating member 70 may be formed at the same time as the inner interconnections 71. Alternatively, the heat dissipating member 70 may be formed of a different material from the inner interconnections 71 by a process different from a process of forming the inner interconnections 71. The interposer substrate 60 of FIG. 4A may be formed by a low temperature co-fired ceramic process.

First and second heat dissipating members 70 may be disposed within the substrate body 66. First inner interconnections 71 and second inner interconnections 74 may be disposed within the substrate body 66. Each of the first conductive vias 68 may be connected between a corresponding one of the first conductive patterns 62 and a corresponding one of the first inner interconnections 71. Second conductive vias 67 may be disposed within the substrate body 66. Each of the second conductive vias 67 may be connected between a corresponding one of the first inner interconnections 71 and a corresponding one of the second inner interconnections 74. Third conductive vias 65 may be disposed within the substrate body 66 connecting each of the second inner interconnections 74 to a corresponding one of the second conductive patterns 64.

A first protection layer 72 may cover the top surface 66*a* of the substrate body 66 of the interposer substrate 60 and exposing at least portions of the first conductive patterns 62. A second protection layer 72 may cover the bottom surface 66*b* of the substrate body 66 of the interposer substrate 60 and exposing at least portions of the second conductive patterns 64.

Figure 4B:
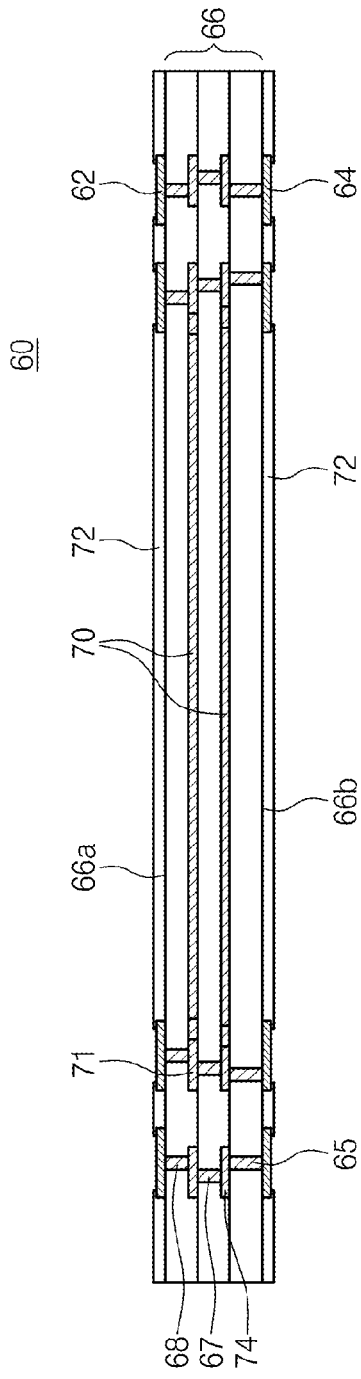
FIG. 4B is a cross-sectional view similar to FIG. 4A, according to an alternate embodiment of the inventive concepts.

FIG. 4B is a cross-sectional view similar to FIG. 4A, according to an alternate embodiment of the inventive concepts. In this alternative embodiment, each of the heat dissipating members may be connected to corresponding inner interconnections. For example, one heat dissipating member 70 may be connected to first inner interconnections 71 and another heat dissipating member 70 may be connected to second inner interconnections 74.

Figure 5:
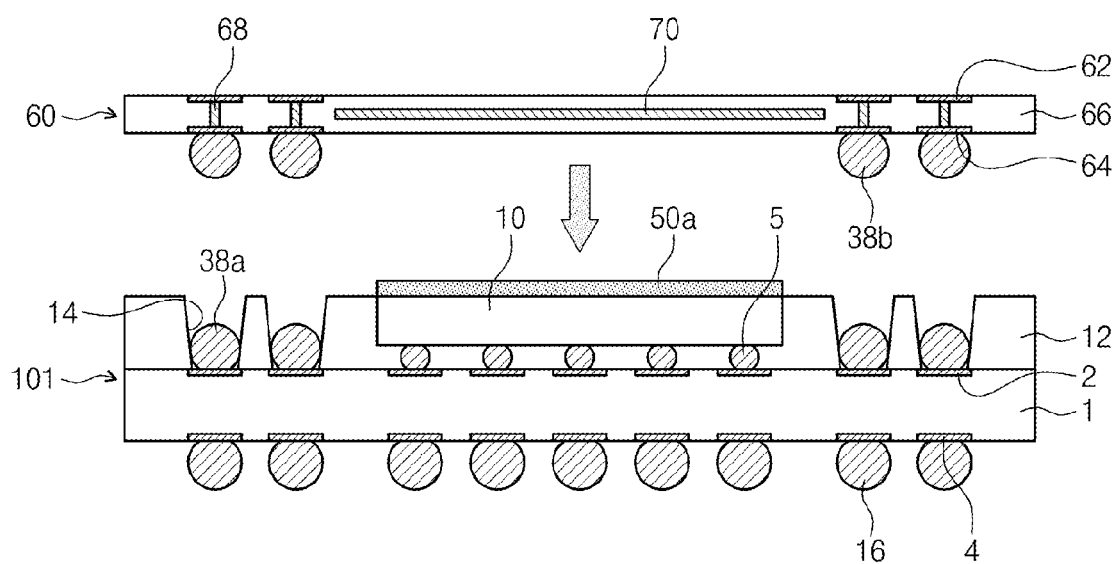
FIGS. 5 and 6 are cross-sectional views illustrating a method of manufacturing the package-on-package device of FIG. 1.
Figure 6:
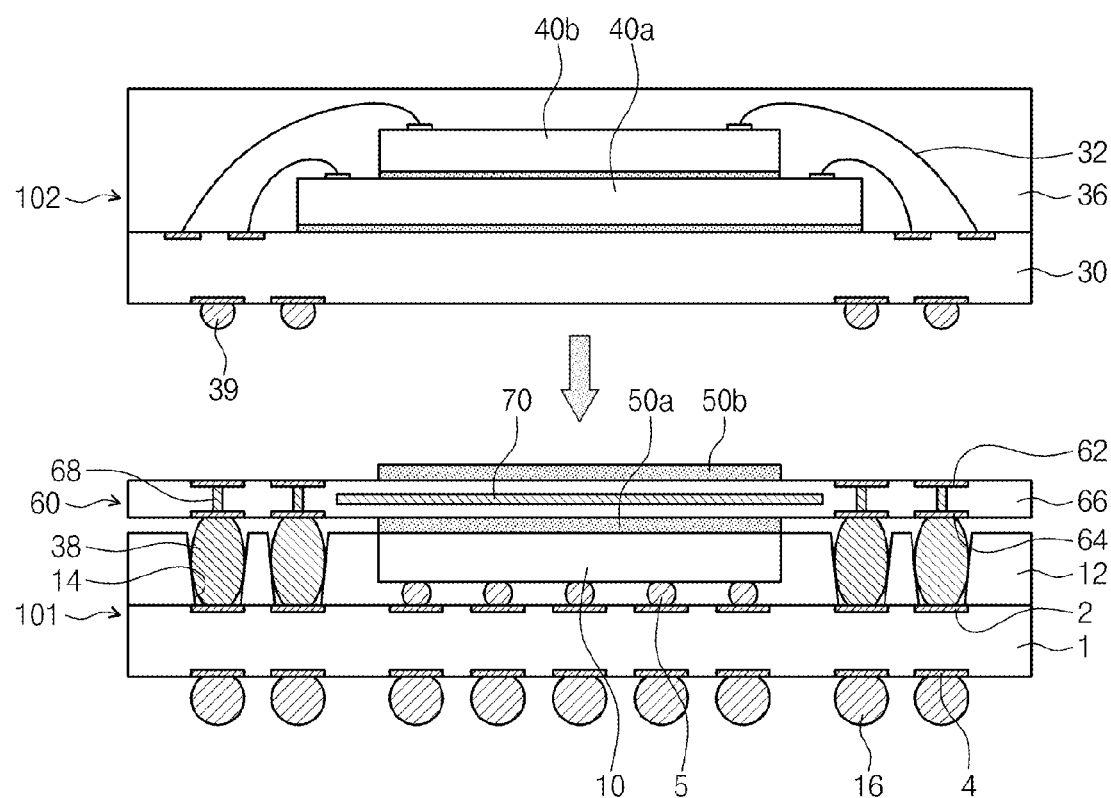

FIGS. 5 and 6 are cross-sectional views illustrating a method of manufacturing the package-on-package device 200 of FIG. 1.

Referring to FIG. 5, a lower package substrate 1 including first and second lower conductive patterns 2 and 4 are prepared. The first lower conductive patterns 2 are disposed on a top surface of the lower package substrate 1, and the second lower conductive patterns 4 are disposed on a bottom surface of the lower package substrate 1. A lower semiconductor chip 10 is mounted on the lower package substrate 1 by a flip chip bonding technique with first lower solder bumps 5 disposed between the lower chip 10 and the lower package substrate 1. First sub-connecting members 38*a* are adhered to the first lower conductive patterns 2, which need not be bonded to the lower semiconductor chip 10. A lower mold layer 12 is formed to cover a sidewall of the lower semiconductor chip 10 and the top surface of the lower package substrate 1. The lower mold layer 12 may be formed to cover a top surface of the lower semiconductor chip 10. In this case, a chemical mechanical polishing (CMP) process may be additionally performed in order to expose the top surface of the lower semiconductor chip 10. The lower mold layer 12 may be partially removed to form connecting holes 14 exposing the first sub-connecting members 38*a*. The process of partially removing the lower mold layer 12 may be performed using a laser.

Second sub-connecting members 38*b* are adhered to second conductive patterns 64 of an interposer substrate 60 within which a heat dissipating member 70 is disposed. A first thermal boundary material layer 50*a* is disposed on the lower semiconductor chip 10, and the interposer substrate 60 may be disposed on the first thermal boundary material layer 50*a*. The second sub-connecting members 38*b* are inserted into the connecting holes 14 such that the sub-connecting members 38*a* and 38*b* come in contact with each other.

Referring to FIG. 6, the sub-connecting members 38*a* and 38*b* (of FIG. 5) are heated at a temperature equal to or greater than a melting point of the sub-connecting members 38*a* and 38*b*, so that they are melted and bonded to each other, thereby forming first connecting members 38. Second connecting members 39 are adhered to a bottom surface of an upper package substrate 30. A second thermal boundary material layer 50*b* is disposed on the interposer substrate 60. The upper semiconductor package 102 is disposed on the second thermal boundary material layer 50*b*, and the second connecting members 39 are heated at a temperature equal to or greater than a melting point of the second connecting members 39 to bond the second connecting members 39 to first conductive patterns 62 of the interposer substrate 60.

Figure 7:
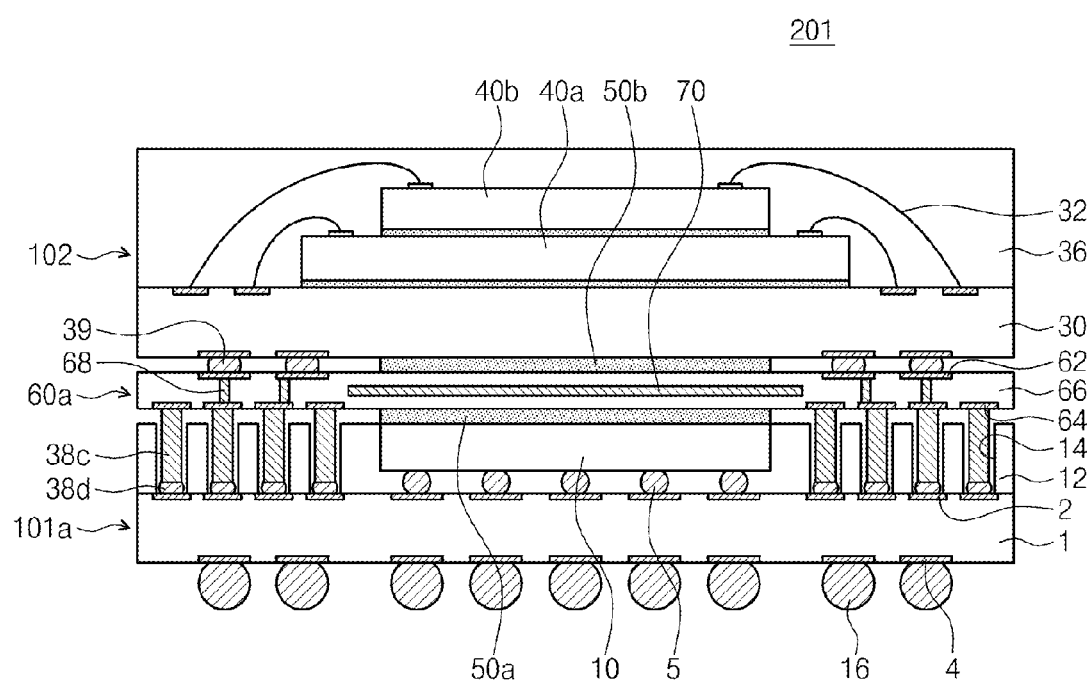
FIG. 7 is a cross-sectional view illustrating a package-on-package device according to a second embodiment of the inventive concepts.

FIG. 7 is a cross-sectional view illustrating a package-on-package device according to a second embodiment of the inventive concepts.

Referring to FIG. 7, in a package-on-package (PoP) device 201 according to the present embodiment, each of the connecting members bonded to second conductive patterns 64 of an interposer substrate 60*a* includes a first bump 38*c* and a second bump 38d adhered to a bottom surface of the first bump 38c. The first bump 38c and the second bump 38d may include different metals from each other. For example, the first bump 38c may be formed of copper (Cu), and the second bump 38d may include lead (Pb). Widths of the first and second bumps 38c and 38d may be less than a width of the first connecting member 38 (of FIG. 6). The number of the second conductive patterns 64 of the interposer substrate 60a may be more than the number of the second conductive patterns 64 of the interposer substrate 60 of FIG. 6. In the present embodiment, a stack height of the PoP device 201 may be reduced, and the number of the input/output pads of the PoP device 201 may be increased.

Other elements of the present embodiment may be the same as or similar to corresponding elements of the first embodiment, and therefore, a detailed description of such element is not repeated.

FIGS. 8 to 12 are cross-sectional views illustrating a method of manufacturing the package-on-package of FIG. 7.

Figure 8:
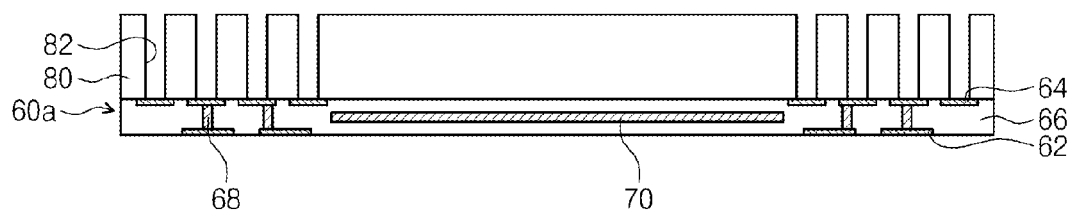
FIGS. 8 to 12 are cross-sectional views illustrating a method of manufacturing the package-on-package of FIG. 7.

Referring to FIG. 8, an interposer substrate 60a including a heat dissipating member 70 is turned over such that second conductive patterns 64 face upwards. A mask pattern 80 including holes 82 is formed on the interposer substrate 60a. The holes 82 expose the second conductive patterns 64. The mask pattern 80 may be, for example, a photoresist pattern. The mask pattern 80 may be formed by a photolithography process.

Figure 9:
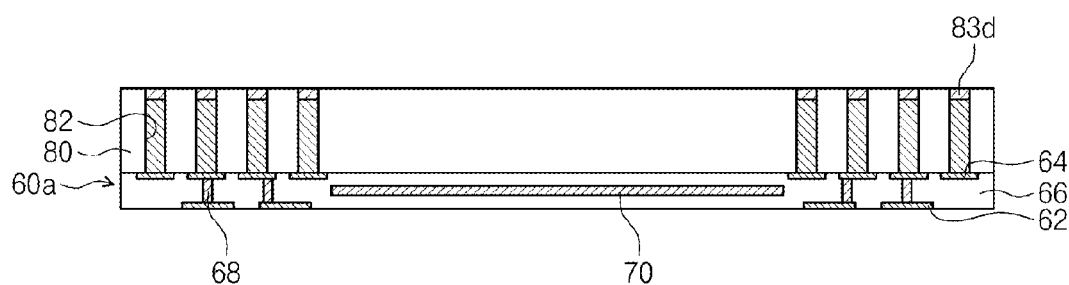

Referring to FIG. 9, a plurality of plating processes may be performed to sequentially form a first bump 83c and a second bump 83d in each of the holes 82. The first bump 83c may be formed of, for example, copper (Cu). The second bump 83d may be formed of, for example, lead (Pb).

Figure 10:
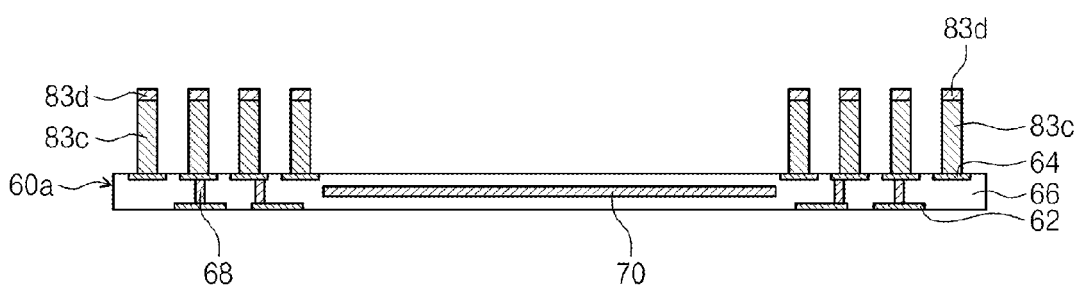

Referring to FIG. 10, the mask pattern 80 is removed to expose the bumps 83c and 83d, and the interposer substrate 60a. If the mask pattern 80 is the photoresist pattern, the mask pattern 80 may be removed by an ashing process.

Figure 11:
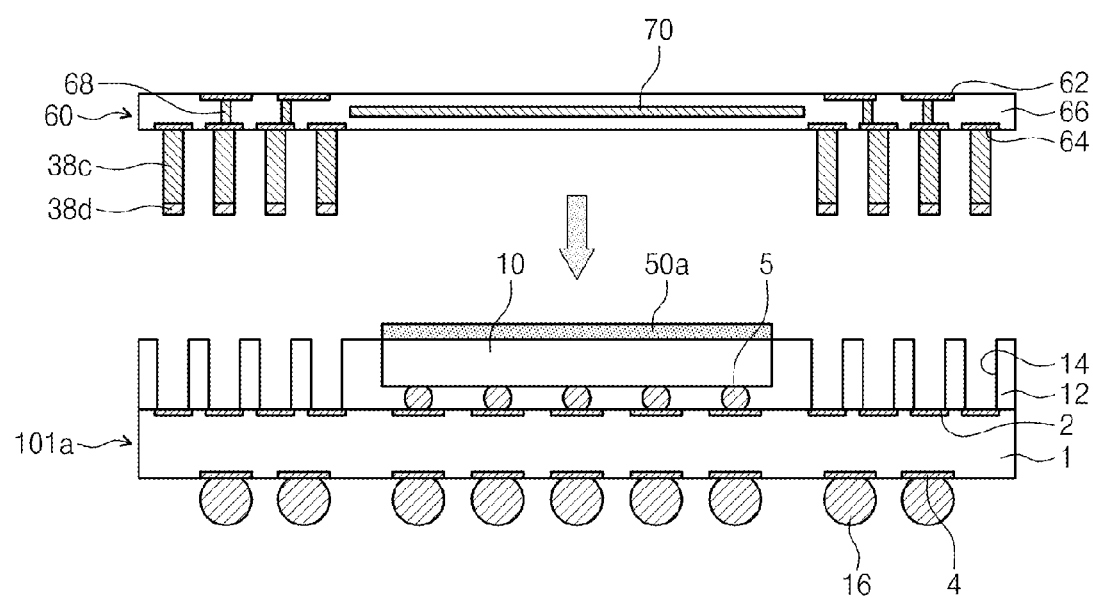

Referring to FIG. 11, a lower package substrate 1 including first and second lower conductive patterns 2 and 4 is prepared. The first lower conductive patterns 2 are disposed on a top surface of the lower package substrate 1, and the second lower conductive patterns 4 are disposed on a bottom surface of the lower package substrate 1. A lower semiconductor chip 10 is mounted on the lower package substrate 1 by a flip chip bonding technique with first lower solder bumps 5 therebetween. A lower mold layer 12 is formed to cover a sidewall of the lower semiconductor chip 10 and the top surface of the lower package substrate 1. The lower mold layer 12 may be partially removed to form connecting holes 14 exposing the first lower conductive patterns 2. The process of partially removing the lower mold layer 12 may use laser.

Next, the interposer substrate 60a of FIG. 10 is turned over such that the second bumps 38d face downwards. A first thermal boundary material layer 50a is disposed on the lower semiconductor chip 10, and the interposer substrate 60a is then disposed thereon, thereby inserting the bumps 38c and 38d into the connecting holes 14. Subsequently, the second bump 38d may be heated at a temperature equal to or greater than a melting point of the second bump 38d such that the second bump 38d may be melted and bonded to the first lower conductive pattern 2.

Figure 12:
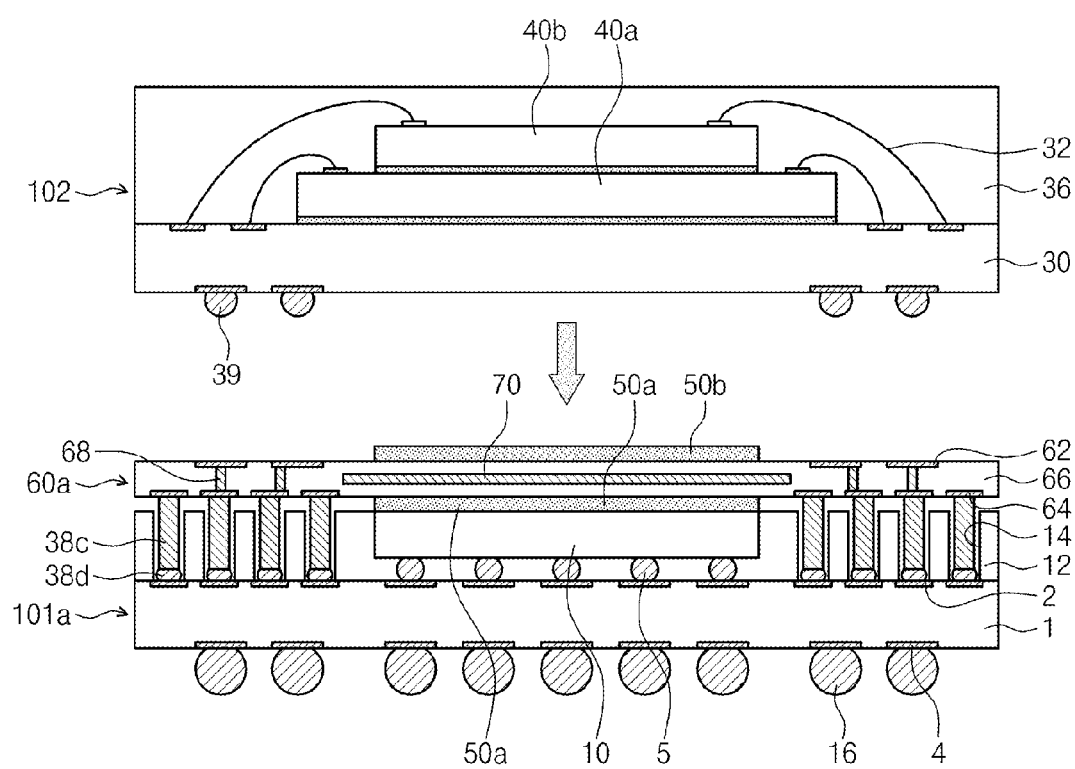

Referring to FIG. 12, second connecting members 39 are bonded to a top surface of an upper package substrate 30. A second thermal boundary material layer 50b is disposed on the interposer substrate 60a. The upper semiconductor package 102 is disposed on the second thermal boundary material layer 50b, and then the second connecting members 39 are heated at a temperature equal to or greater than a melting point of the second connecting members 39 to bond the second connecting members 39 to first conductive patterns 62 of the interposer substrate 60a.

Other manufacturing processes of the present embodiments may be the same as or similar to corresponding processes of the first embodiment, and therefore, a detailed description of such processes is not repeated.

Figure 13:
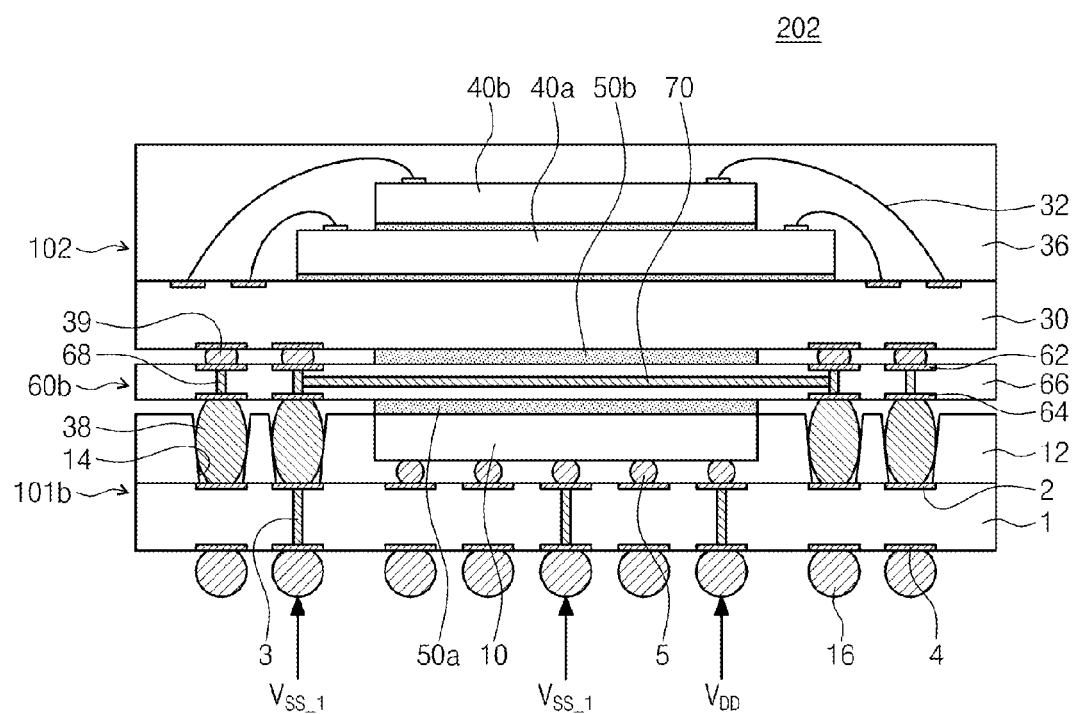
FIG. 13 is a cross-sectional view illustrating a package-on-package device according to a third embodiment of the inventive concepts.
Figure 14:
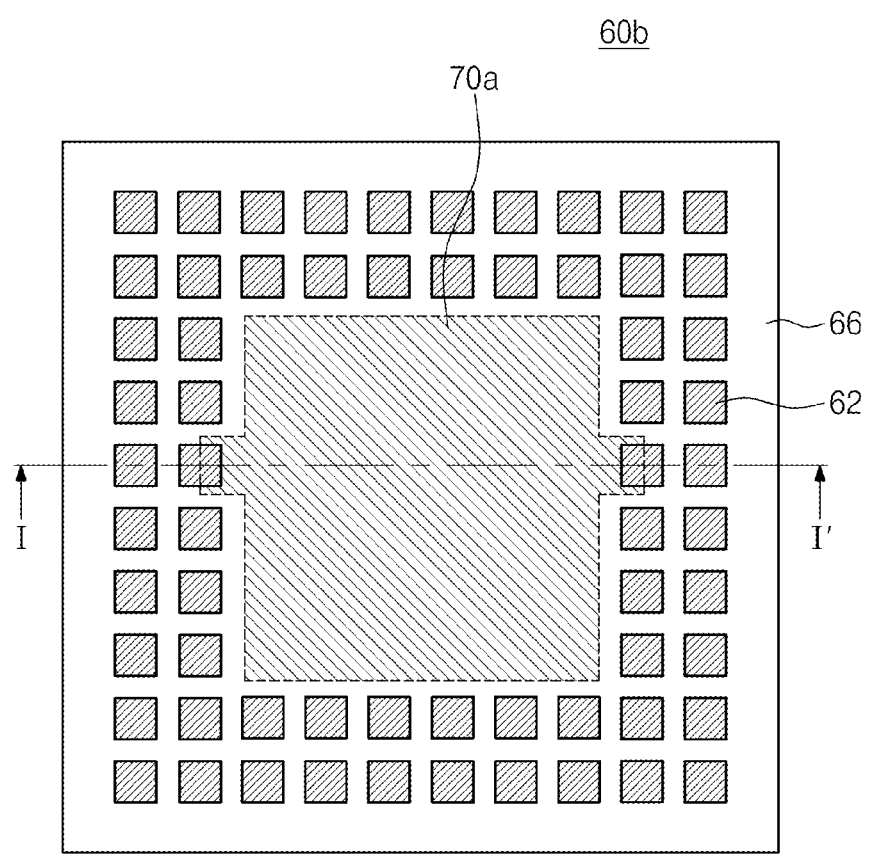
FIG. 14 is a plan view illustrating an interposer substrate according to the third embodiment of the inventive concepts.
Figure 15:
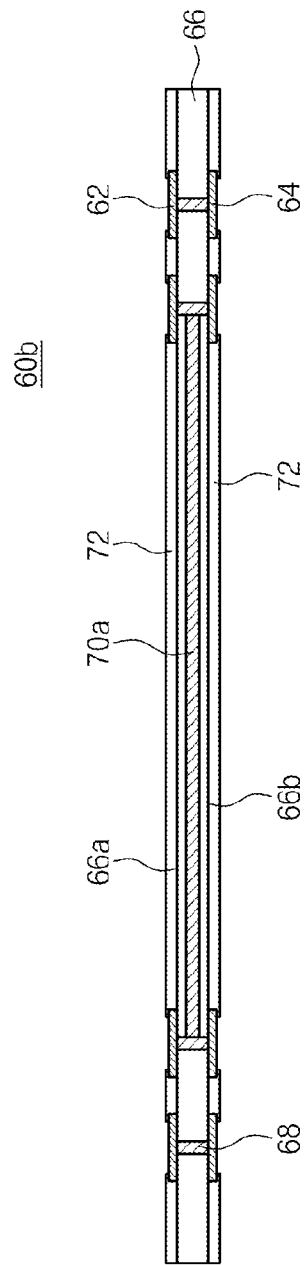
FIGS. 15 and 16 are cross-sectional views taken along a line I-I' of FIG. 14 according to the third embodiment of the inventive concepts.
Figure 16:
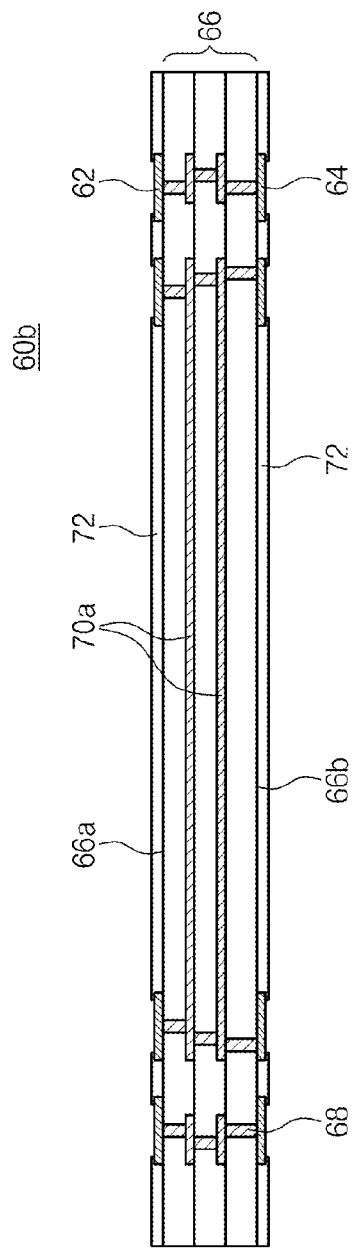

FIG. 13 is a cross-sectional view illustrating a package-on-package device according to a third embodiment of the inventive concepts. FIG. 14 is a plan view illustrating an interposer substrate according to the third embodiment of the inventive concepts. FIGS. 15 and 16 are cross-sectional views taken along a line I-I' of FIG. 14 according to the third embodiment of the inventive concepts.

Referring to FIGS. 13 to 16, a heat dissipating member 70a may be in contact with a conductive via 68 in an interposer substrate 60b of a package-on-package (PoP) device 202 according to the present embodiment. In other words, the heat dissipating member 70a may be electrically connected to the conductive via 68. A body 66 of the interposer substrate 60b may be formed of a single layer as illustrated in FIG. 15 or of a multi-layer structure as illustrated in FIG. 16. In some embodiments, the heat dissipating member 70a may be in contact with the conductive via 68 in the body 66 formed of the single layer as illustrated in FIG. 15. In other embodiments, the heat dissipating member 70a may include a plurality of stacked heat dissipating members 70a, as illustrated in FIG. 16. The plurality of stacked heat dissipating members 70a may be in contact with stacked conductive vias 68, as illustrated in FIG. 16. A lower semiconductor package 101b may further include a lower conductive via 3 that penetrates the lower package substrate 1 to connect a first lower conductive pattern 2 to a second lower conductive pattern 4. A first ground voltage $V_{ss\_1}$ may be applied to a second lower solder bump 16 that is electrically connected to the heat dissipating member 70a. A second ground voltage $V_{ss\_2}$ and a power voltage $V_{DD}$ may be respectively applied to some of the second lower solder bumps 16 that are electrically connected to the lower semiconductor chip 10. In this case, the heat dissipating member 70a may also act as an electromagnetic wave shielding layer between the lower semiconductor package 101b and the upper semiconductor package 102. Since the interposer substrate 60b and the lower semiconductor chip 10 are grounded through different paths from each other, electrostatic discharge (ESD) noise of the PoP device 202 may be effectively improved or reduced.

Other elements of the present embodiment may be the same as or similar to corresponding elements of the first embodiment, and therefore, a detailed description of such elements is not repeated.

Figure 17:
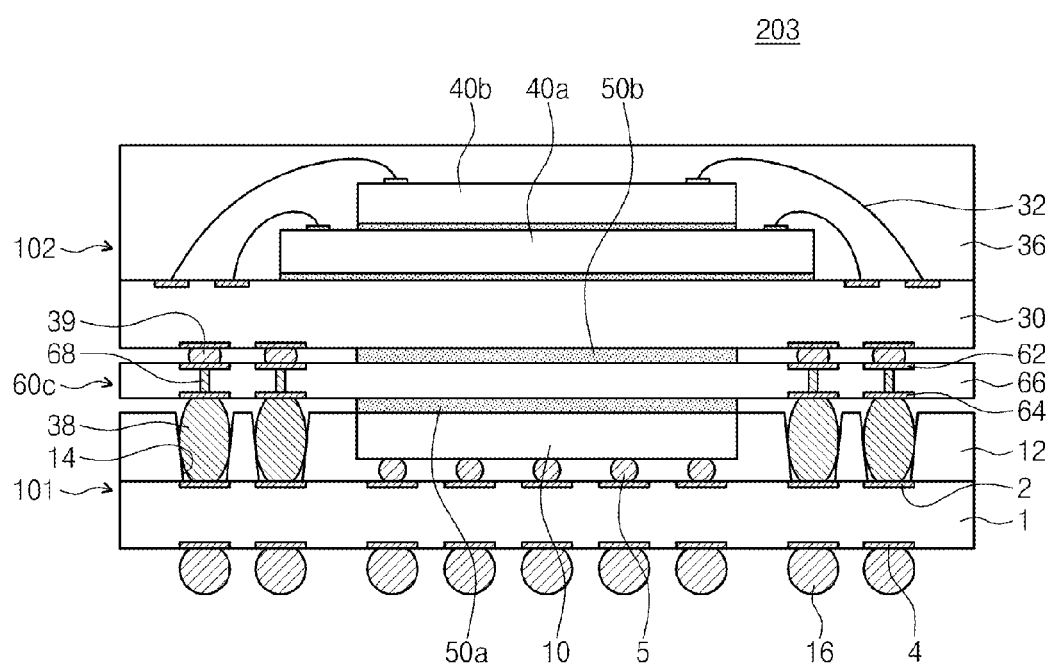
FIG. 17 is a cross-sectional view illustrating a package-on-package device according to a fourth embodiment of the inventive concepts.

FIG. 17 is a cross-sectional view illustrating a package-on-package device according to a fourth embodiment of the inventive concepts.

Referring to FIG. 17, an interposer substrate 60c of a package-on-package (PoP) device 203 according to the present embodiment need not include the heat dissipating member. If a body 66 of the interposer substrate 60c is formed of a material having an excellent insulating property and excellent thermal conductivity, the interposer substrate 60c may itself include the heat dissipating member. Alternatively, even though the interposer substrate 60c is a general printed circuit board, the general printed circuit board has a thermal conductivity higher than that of air such that the interposer substrate 60c effectively exhausts the heat generated from the PoP device 203. Other elements of the present embodiment may be the same as or similar to corresponding elements of the first embodiment, and therefore, a detailed description of such elements is not repeated.

Figure 18:
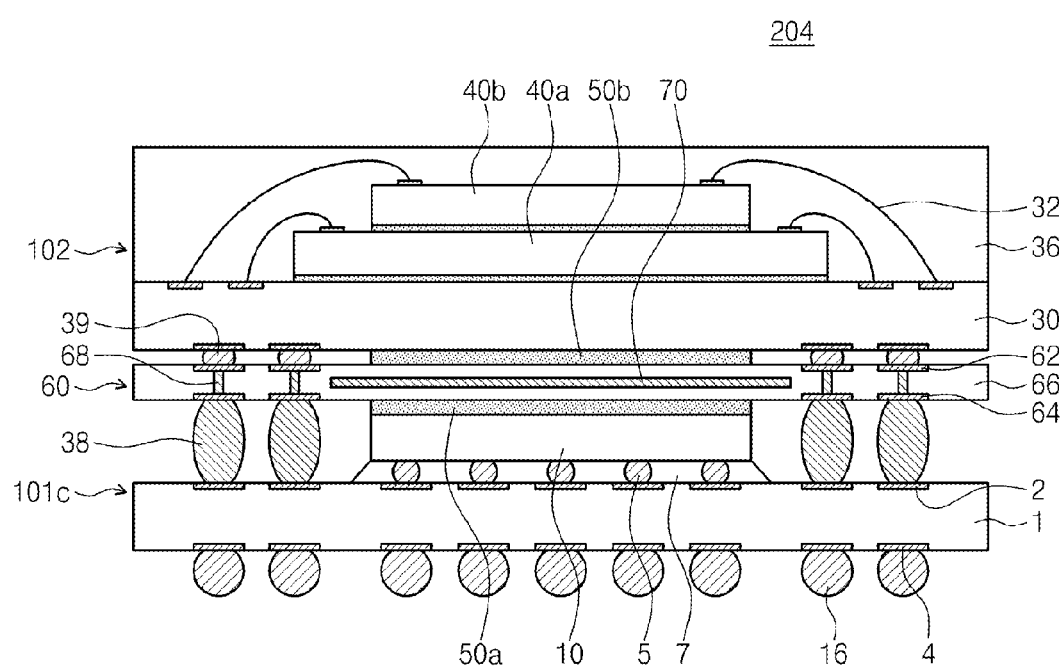
FIG. 18 is a cross-sectional view illustrating a package-on-package device according to a fifth embodiment of the inventive concepts.

FIG. 18 is a cross-sectional view illustrating a package-on-package device according to a fifth embodiment of the inventive concepts.

Referring to FIG. 18, a lower semiconductor package 101c need not include a lower mold layer in a package-on-package device 204 according to the present embodiment. In this case, an underfill resin layer 7 may be disposed between a lower semiconductor chip 10 and a lower package substrate 1. Other elements of the present embodiment may be the same as or similar to corresponding elements of the first embodiment, and therefore, a detailed description of such element is not repeated.

Figure 19:
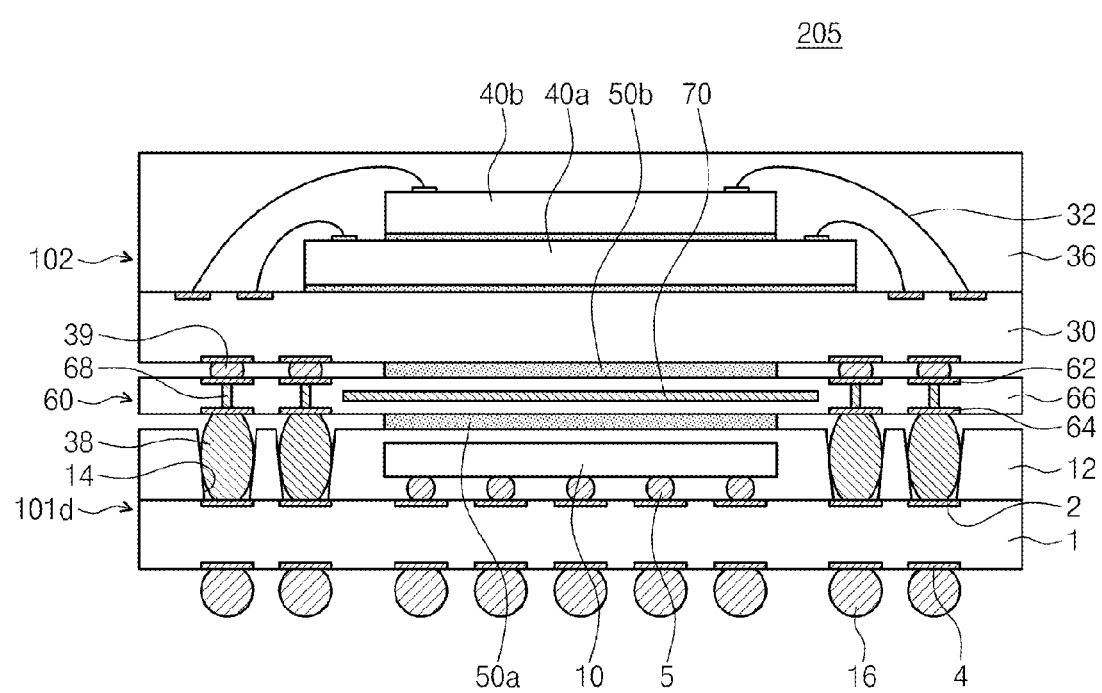
FIG. 19 is a cross-sectional view illustrating a package-on-package device according to a sixth embodiment of the inventive concepts.

FIG. 19 is a cross-sectional view illustrating a package-on-package device according to a sixth embodiment of the inventive concepts.

Referring to FIG. 19, a top surface of the lower semiconductor chip 10 may be covered with a lower mold layer 12 in a package-on-package device 205 according to the present embodiment. In this case, a first thermal boundary material layer 50a may be in contact with a top surface of the lower mold layer 12. Other elements of the present embodiment may be the same as or similar to corresponding elements of the first embodiment, and therefore, a detailed description of such elements is not repeated.

Figure 20:
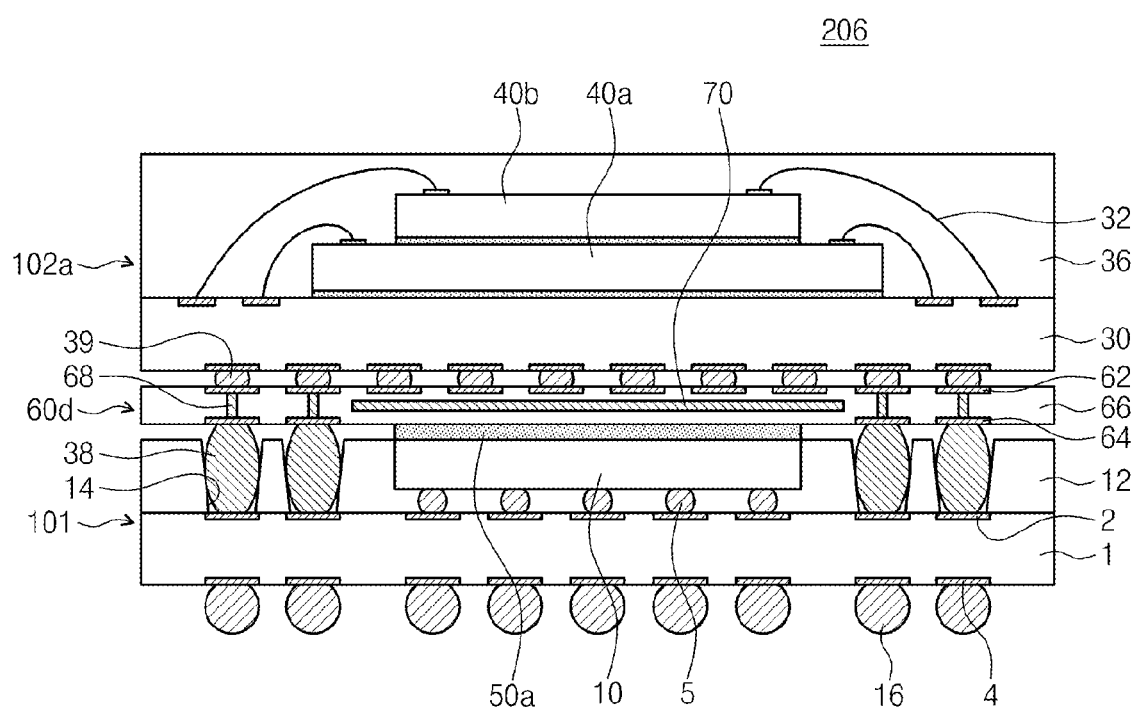
FIG. 20 is a cross-sectional view illustrating a package-on-package device according to a seventh embodiment of the inventive concepts.

FIG. 20 is a cross-sectional view illustrating a package-on-package device according to a seventh embodiment of the inventive concepts.

Referring to FIG. 20, a second thermal boundary material layer need not be disposed between an interposer substrate 60d and an upper semiconductor chip 102a in a package-on-package device 206 according to the present embodiment. Additionally, the number of first conductive patterns 62 and the number of second connecting members 39 of the present embodiment may be greater than those of the first embodiment. Other elements of the present embodiment may be the same as or similar to corresponding elements of the first embodiment, and therefore, a detailed description of such elements is not repeated.

Figure 21A:
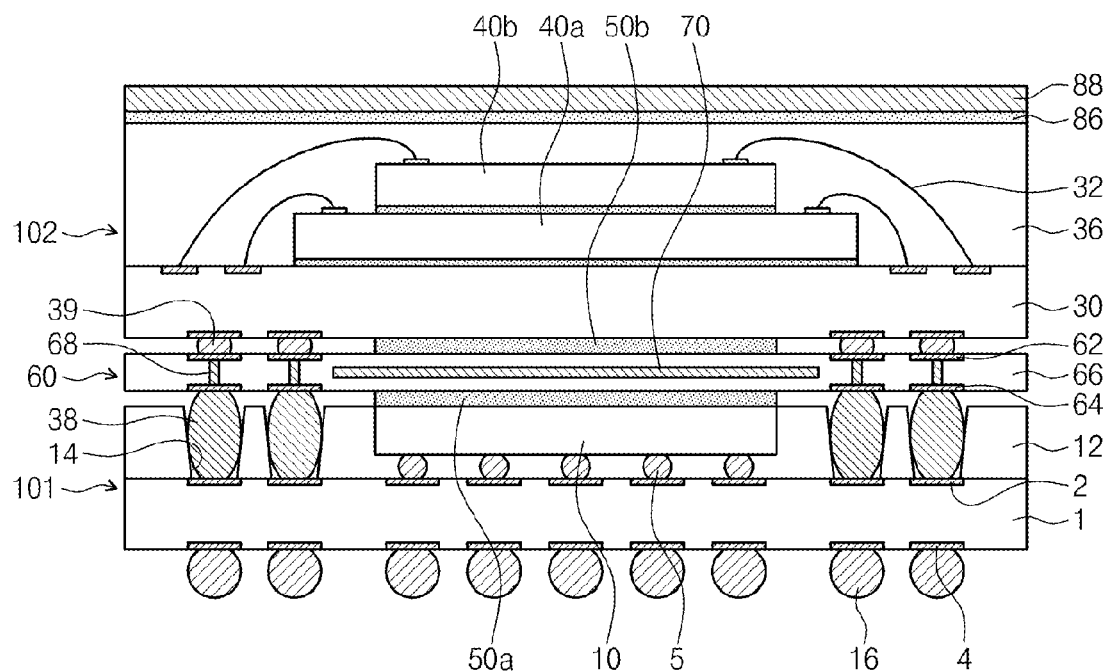
FIG. 21A is a cross-sectional view illustrating a package-on-package device according to an eighth embodiment of the inventive concepts.

FIG. 21A is a cross-sectional view illustrating a package-on-package device according to an eighth embodiment of the inventive concepts.

Referring to FIG. 21A, a third thermal boundary material layer 86 and a heat radiating plate 88 are sequentially stacked on an upper semiconductor package 102 in a package-on-package device 207 according to the present embodiment. The third thermal boundary material layer 86 may be an adhesive layer. The heat radiating plate 88 may be a metal plate or a metal tape having flexibility. Other elements of the present embodiment may be the same as or similar to corresponding elements of the first embodiment, and therefore, a detailed description of such element is not repeated.

Figure 21B:
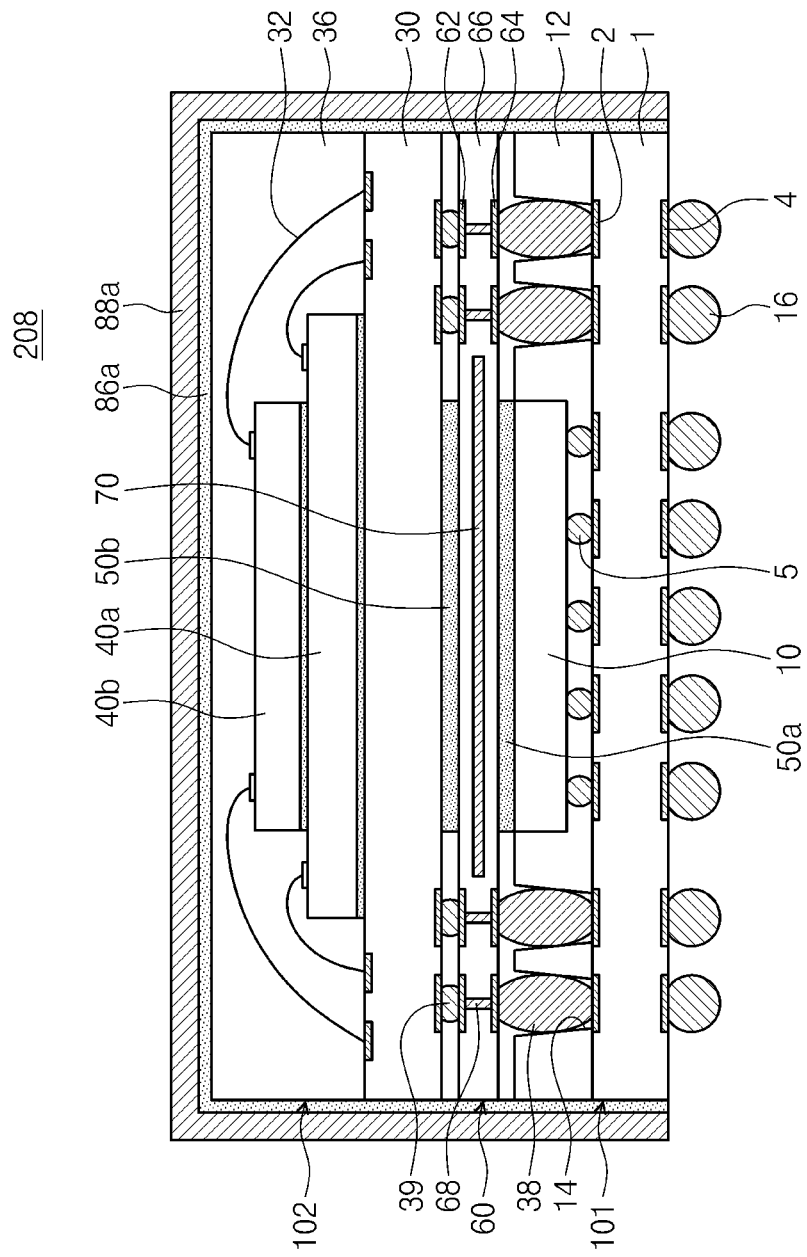
FIG. 21B is a cross-sectional view illustrating a package-on-package device according to a ninth embodiment of the inventive concepts.

FIG. 21B is a cross-sectional view illustrating a package-on-package device according to a ninth embodiment of the inventive concepts.

Referring to FIG. 21B, a third thermal boundary material layer 86a and a heat radiating plate 88a on an upper semiconductor package 102 may extend to cover sidewalls of the upper semiconductor package 102, an interposer substrate 60, and a lower semiconductor package 101 in a package-on-package device 208 according to the present embodiment. A second lower solder bump 16 may also be bonded to a bottom surface of the heat radiating plate 88a. In this case, a heat exhausting effect may be increased. In the present embodiment, the heat radiating plate 88a provides an electromagnetic interference (EMI) shielding function as well as the heat radiating function. Thus, malfunctions of the semiconductor packages are reduced or altogether prevented.

Figure 22:
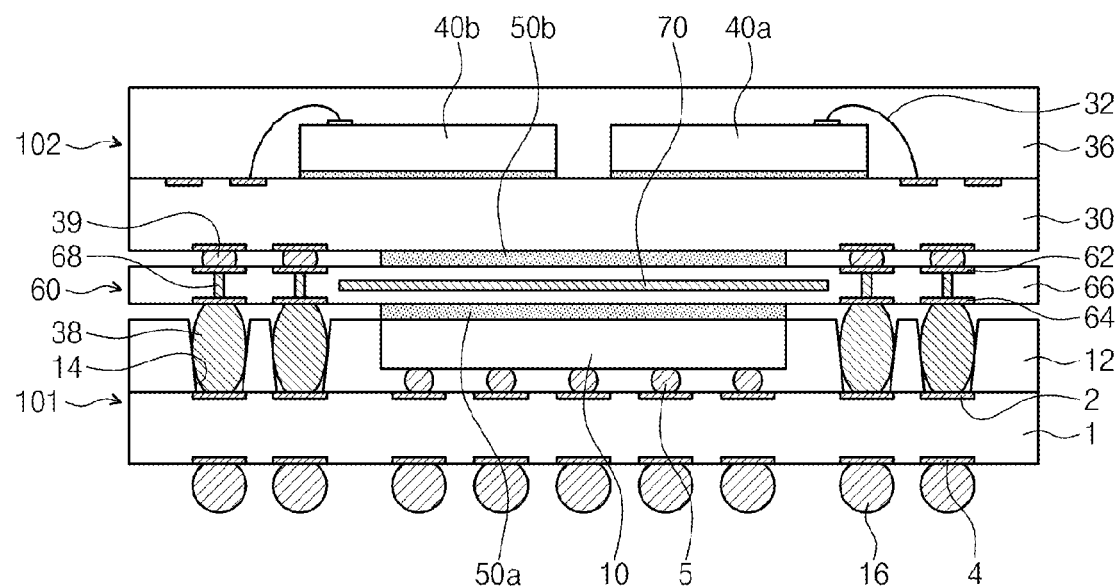
FIG. 22 is a cross-sectional view illustrating a package-on-package device according to a tenth embodiment of the inventive concepts.

FIG. 22 is a cross-sectional view illustrating a package-on-package device according to a tenth embodiment of the inventive concepts.

Referring to FIG. 22, in a package-on-package device 209 according to the present embodiment, upper semiconductor chips 40a and 40b may be disposed side by side on an upper package substrate 30 in an upper semiconductor package 102b. Thus, a thickness of the package-on-package device 209 may be reduced. Other elements of the present embodiment may be the same as or similar to corresponding elements of the first embodiment, and therefore, a detailed description of such element is not repeated.

The semiconductor packaging techniques described above may be applied to various kinds of semiconductor devices and package modules including the same.

Figure 23:
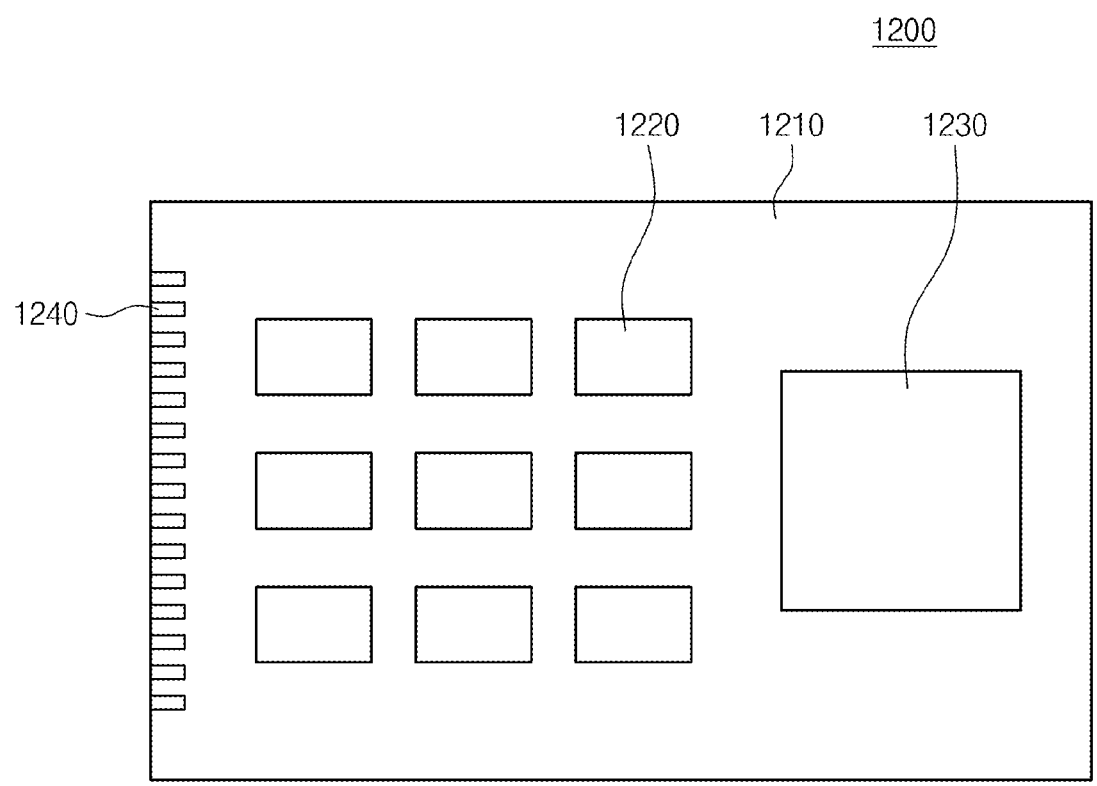
FIG. 23 is a diagram illustrating an example of a package module including a package-on-package device according to embodiments of the inventive concepts.

FIG. 23 is a diagram illustrating an example of a package module including a package-on-package device according to embodiments of the inventive concepts. Referring to FIG. 23, a package module 1200 may include a semiconductor integrated circuit chip 1220 and a semiconductor integrated circuit chip 1230 packaged using a quad flat package (QFP) technique. The devices 1220 and 1230 applied with the semiconductor packaging techniques according to the inventive concepts may be mounted on a module substrate 1210, thereby forming the package module 1200. The package module 1200 may be connected to an external electronic device through external connection terminals 1240 provided on a side of the module substrate 1210.

Figure 24:
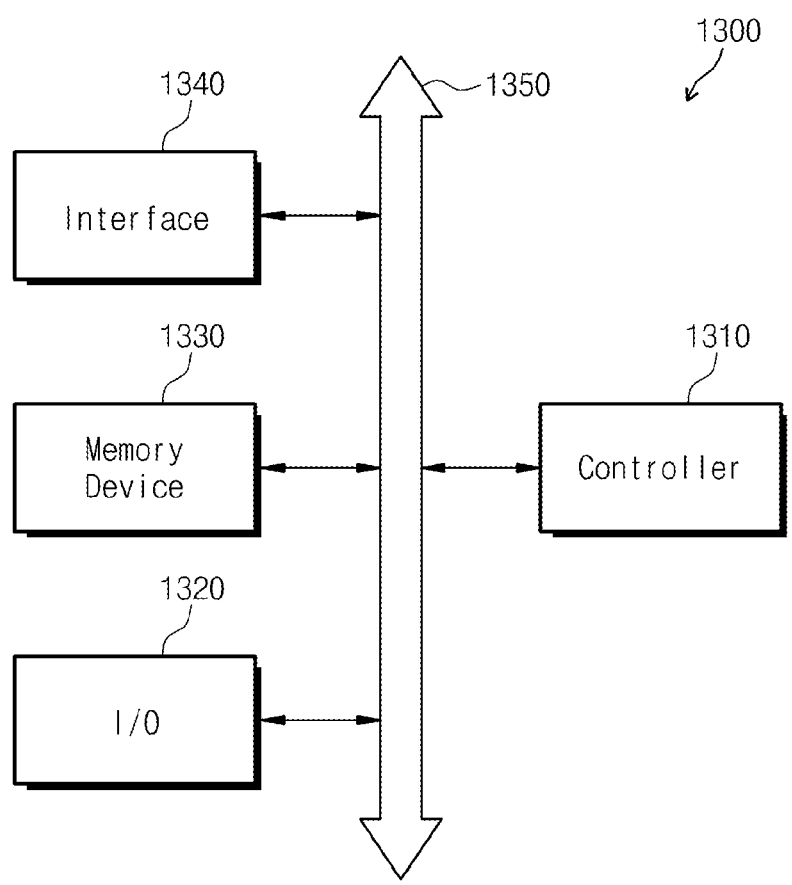
FIG. 24 is a schematic block diagram illustrating an example of an electronic system including a package-on-package device according to embodiments of the inventive concepts.

The semiconductor packaging techniques described above may be applied to an electronic system. FIG. 24 is a schematic block diagram illustrating an example of an electronic system including a package-on-package device according to embodiments of the inventive concepts. Referring to FIG. 24, an electronic system 1300 may include a controller 1310, an input/output (I/O) unit 1320, and a memory device 1330. The controller 1310, the I/O unit 1320, and the memory device 1330 may communicate with each other through a data bus 1350. The data bus 1350 may correspond to a path through which electrical signals are transmitted. For example, the controller 1310 may include at least one of a microprocessor, a digital signal processor, a microcontroller, or other logic devices having a similar function to any one thereof. The controller 1310 and the memory device 1330 may include at least one of the semiconductor packages according to the aforementioned embodiments of the inventive concept. The I/O unit 1320 may include a keypad, a keyboard and/or a display unit. The memory device 1330 is a device storing data. The memory device 1330 may store at least one of data and commands executed by the controller 1310. The memory device 1330 may include at least one of a volatile memory device and a non-volatile memory device. In some embodiments, the memory device 1330 may include a flash memory device. For example, the flash memory device applied with the semiconductor packaging technique according to the inventive concept may be installed in an information processing system such as a mobile device or a desk top computer. The flash memory device may be realized as solid state disks (SSD). In this case, the electronic system 1300 may stably store massive data in the memory device 1330. The electronic system 1300 may further include an interface unit 1340, which may transmit electrical data to a communication network or receive electrical data from a communication network. The interface unit 1340 may operate by wireless or cable. For example, the interface unit 1340 may include an antenna for wireless communication or a transceiver for cable communication. Although not shown in the drawings, the electronic system 1300 may further include at least one of an application chipset and a camera image processor (CIS).

The electronic system 1300 may be realized as a mobile system, a personal computer, an industrial computer, or a multi-functional logic system. For example, the mobile system may be one of a personal digital assistant (PDA), a portable computer, a web tablet, a wireless phone, a mobile phone, a laptop computer, a digital music player, a memory card, or an information transmitting/receiving system. If the electronic system 1300 is an apparatus capable of performing a wireless communication, the electronic device 1300 may be used in a communication interface protocol such as a third generation communication system (e.g., CDMA, GSM, NADC, E-TDMA, WCDMA, CDMA2000).

Figure 25:
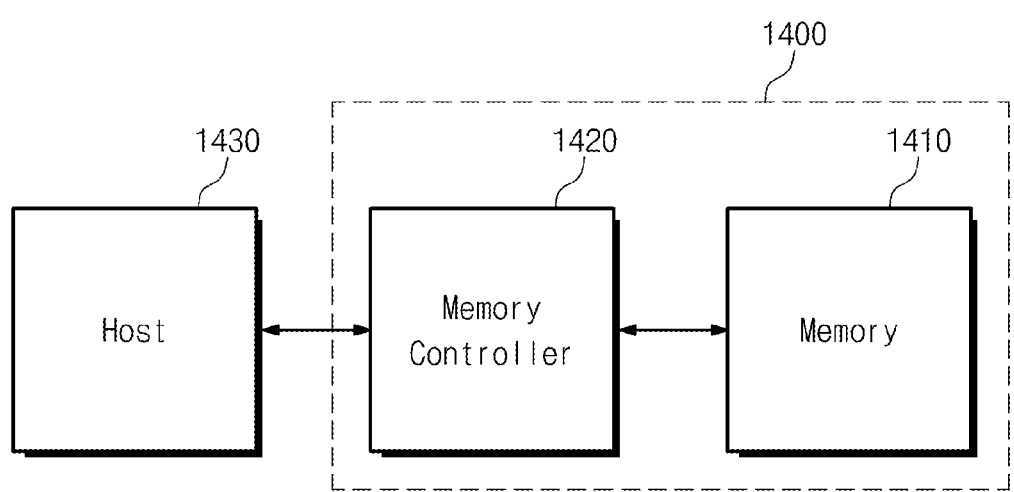
FIG. 25 is a schematic block diagram illustrating an example of a memory system including a package-on-package device according to embodiments of the inventive concepts.

Semiconductor devices applied with the aforementioned techniques of the inventive concepts may be provided in a memory system. FIG. 25 is a schematic block diagram illustrating an example of a memory system including a package-on-package device according to embodiments of the inventive concepts. Referring to FIG. 25, a memory system 1400 may include a non-volatile memory device 1410 and a memory controller 1420. The non-volatile memory device 1410 and the memory controller 1420 may store data or may read stored data. The non-volatile memory device 1410 may include at least one non-volatile memory device applied with the semiconductor packaging techniques according to the aforementioned embodiments of the inventive concept. The memory controller 1420 may read data from and/or store data into the non-volatile memory device 1410 in response to read and/or write request of a host 1430.

In the package-on-package device according to embodiments of the inventive concepts, the interposer substrate is disposed between the lower semiconductor package and the upper semiconductor package, and the thermal boundary material layer is disposed between the interposer substrate and the lower semiconductor package. Thus, it is possible to rapidly exhaust the heat generated from the lower semiconductor chip included in the lower semiconductor package. As a result, the operating speed of the package-on-package device may be improved, and the malfunction problem may be solved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A package-on-package (PoP) device comprising:
a lower semiconductor package including a lower package substrate and a lower semiconductor chip mounted on the lower package substrate;
an upper semiconductor package disposed on the lower semiconductor package, the upper semiconductor package including an upper package substrate and an upper semiconductor chip mounted on the upper package substrate;
an interposer substrate disposed between the lower semiconductor package and the upper semiconductor package, the interposer substrate electrically connecting the lower semiconductor package to the upper semiconductor package; and
a first thermal boundary material layer disposed between the lower semiconductor package and the interposer substrate,
wherein the first thermal boundary material layer and the lower semiconductor chip vertically overlap, and
wherein the lower semiconductor chip is electrically connected to the lower package substrate through bumps,
wherein the lower semiconductor package further comprises a connecting member spaced apart from the lower semiconductor chip on the lower package substrate,
wherein the connecting member electrically connects the lower package substrate to the interposer substrate,
wherein the connecting member includes at least one of a conductive bump and a solder ball,
wherein the lower semiconductor package further comprises a lower mold layer covering a top surface of the lower package substrate and a sidewall of the lower semiconductor chip, and
wherein the lower mold layer includes a hole in which the connecting member is disposed,
wherein the lower mold layer extends to cover a top surface of the lower semiconductor chip.

2. The PoP device of claim 1, wherein the interposer substrate has a thermal conductivity of about 10 watts per meter Kelvin (W/mK) or more.

3. The PoP device of claim 1, wherein the interposer substrate comprises:
a substrate body;
an upper conductive pattern and a lower conductive pattern disposed on a top surface and a bottom surface of the substrate body, respectively; and
a conductive via penetrating the substrate body and electrically connecting the upper conductive pattern to the lower conductive pattern,
wherein the first thermal boundary material layer is disposed directly on a top surface of the lower semiconductor chip and spaced apart from the conductive via.

4. The PoP device of claim 3, wherein the interposer substrate further comprises a planar heat dissipating member disposed centrally within the substrate body.

5. The PoP device of claim 4, wherein the heat dissipating member includes at least one of a metal or graphite.

6. The PoP device of claim 4, wherein the planar heat dissipating member is spaced apart from the conductive via and completely encapsulated centrally within the substrate body.

7. The PoP device of claim 1, further comprising:
a second thermal boundary material layer disposed between the upper package substrate and the interposer substrate.

8. The PoP device of claim 7, wherein the upper semiconductor package further comprises an upper mold layer covering the upper semiconductor chip and the upper package substrate,
the PoP device further comprising:
a third thermal boundary material layer disposed on the upper mold layer; and a heat radiating member disposed on the third boundary material layer.

9. The PoP device of claim 8, wherein the heat radiating member extends to cover a sidewall of the upper semiconductor package, a sidewall of the interposer substrate and a sidewall of the lower semiconductor package.

10. A package-on-package (PoP) device comprising:
a lower semiconductor package including a lower package substrate and a lower semiconductor chip mounted on the lower package substrate;
an upper semiconductor package disposed on the lower semiconductor package, the upper semiconductor package including an upper package substrate and an upper semiconductor chip mounted on the upper package substrate;
an interposer substrate disposed between the lower semiconductor package and the upper semiconductor package, the interposer substrate electrically connecting the lower semiconductor package to the upper semiconductor package; and
a first thermal boundary material layer disposed between the lower semiconductor package and the interposer substrate,
wherein the first thermal boundary material layer and the lower semiconductor chip vertically overlap,
wherein the lower semiconductor chip is electrically connected to the lower package substrate through bumps,
wherein the interposer substrate comprises:
a substrate body;
an upper conductive pattern and a lower conductive pattern disposed on a top surface and a bottom surface of the substrate body, respectively; and
a conductive via penetrating the substrate body and electrically connecting the upper conductive pattern to the lower conductive pattern,
wherein the first thermal boundary material layer is disposed directly on a top surface of the lower semiconductor chip and spaced apart from the conductive via,
wherein the interposer substrate further comprises a planar heat dissipating member disposed centrally within the substrate body,
wherein the heat dissipating member includes at least one of a metal or graphite,
wherein the conductive via is in physical contact with the heat dissipating member, wherein the heat dissipating member is planar with substantially flat upper and lower surfaces along an entire length and width of the heat dissipating member.

11. The PoP device of claim 10, wherein the heat dissipating member is configured to receive a ground voltage.

12. An interposer substrate configured to be interposed between a lower semiconductor package and an upper semiconductor package, the interposer substrate comprising:
a substrate body including an insulating layer having a top surface and a bottom surface;
first conductive patterns arranged adjacent to edges of the top surface of the insulating layer of the substrate body;
second conductive patterns arranged adjacent to edges of the bottom surface of the insulating layer of the substrate body;
conductive vias connecting each of the first conductive patterns to a corresponding one of the second conductive patterns; and a heat dissipating member disposed in the substrate body,
wherein the heat dissipating member is encapsulated within the substrate body, and the first conductive patterns and the second conductive patterns are arranged around the heat dissipating member in a plan view,
wherein the lower semiconductor package includes a lower package substrate and a lower semiconductor chip mounted on the lower package substrate,
wherein the lower semiconductor chip is electrically connected to the lower package substrate through bumps,
wherein the heat dissipating member is referred to as a first planar heat dissipating member and the conductive vias are referred to as first conductive vias, wherein the first planar heat dissipating member is encapsulated centrally within the substrate body and is planar having substantially flat upper and lower surfaces along an entire length and width of the first planar heat dissipating member, the interposer substrate further comprising:
a second planar heat dissipating member having substantially flat upper and lower surfaces along an entire length and width of the second heat dissipating member disposed and encapsulated centrally within the substrate body;
first inner interconnections, wherein each of the first conductive vias is connected between a corresponding one of the first conductive patterns and a corresponding one of the first inner interconnections;
second conductive vias;
second inner interconnections, wherein each of the second conductive vias is connected between a corresponding one of the first inner interconnections and a corresponding one of the second inner interconnections; and
third conductive vias connecting each of the second inner interconnections to a corresponding one of the second conductive patterns.

13. The interposer substrate of claim 12, wherein the substrate body of the interposer substrate has a thermal conductivity of about 10 watts per meter Kelvin (W/mK) or more.

14. The interposer substrate of claim 12, wherein the heat dissipating member includes at least one of a metal or graphite.

15. The interposer substrate of claim 12, further comprising:
a first protection layer covering the top surface of the substrate body of the interposer substrate and exposing at least portions of the first conductive patterns; and
a second protection layer covering the bottom surface of the substrate body of the interposer substrate and exposing at least portions of the second conductive patterns.

16. The interposer substrate of claim 12, wherein:
the first planar heat dissipating member has substantially flat upper surfaces along an entire length and width of the first planar heat dissipating member, flat lower surfaces along the entire length and width of the first planar heat dissipating member, and side surfaces, and
the substrate body completely encapsulates the flat upper surfaces, the flat lower surfaces, and the side surfaces of the first planar heat dissipating member.

* * * * *